(12) United States Patent
Ishinaga

(10) Patent No.: US 6,355,946 B1
(45) Date of Patent: Mar. 12, 2002

(54) SEMICONDUCTOR DEVICE WITH REFLECTOR

(75) Inventor: Hiroki Ishinaga, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/464,515

(22) Filed: Dec. 15, 1999

(30) Foreign Application Priority Data

Dec. 16, 1998 (JP) .............................. 10-357074

(51) Int. Cl.$^7$ .............................................. H01L 33/00
(52) U.S. Cl. ............................ 257/98; 257/99; 257/100
(58) Field of Search ............................ 257/98, 99, 100

(56) References Cited

U.S. PATENT DOCUMENTS

| | | | | |
|---|---|---|---|---|
| 3,991,339 A | * | 11/1976 | Lockwood et al. | 313/499 |
| 4,013,916 A | * | 3/1977 | Brown | 313/510 |
| 4,152,624 A | | 5/1979 | Knaebel | 313/499 |
| 4,964,025 A | * | 10/1990 | Smith | 362/346 |
| 5,291,038 A | * | 3/1994 | Hanamoto et al. | 257/82 |
| 5,479,426 A | * | 12/1995 | Nakanishi et al. | 372/43 |

FOREIGN PATENT DOCUMENTS

| | | | |
|---|---|---|---|
| DE | 4446566 | 6/1996 | |
| EP | 0303741 | 2/1989 | |
| EP | 0854523 | 7/1998 | |
| GB | 1594553 | 7/1981 | |
| JP | 355140281 | * 11/1980 | ............... 257/98 |
| JP | 60-262476 | 12/1985 | |
| JP | 405102531 | * 4/1993 | ............... 257/98 |
| JP | 8-204239 | 8/1996 | |
| JP | 10-161570 | 6/1998 | |
| WO | 97/12386 | 4/1997 | |

OTHER PUBLICATIONS

Michelitsch, "Light–Emitting, Gallium Arsenide Diode", IBM Technical Disclosure Bulletin, vol. 8, No. 1, Jun. 1965, p. 191.*

International Search Report, Jun. 18, 2001.

* cited by examiner

*Primary Examiner*—William Mintel
(74) *Attorney, Agent, or Firm*—Merchant & Gould P.C.

(57) ABSTRACT

A semiconductor device includes a substrate, a semiconductor chip for emitting light, and a reflector enclosing the semiconductor chip for reflecting the light emitted from the semiconductor chip. The substrate is provided with a first electrode and a second electrode each electrically connected with the semiconductor chip. A transverse cross-section of the reflector defines an elongated figure, such as oblong, elliptical, rhombic or rectangular.

12 Claims, 5 Drawing Sheets

SEMICONDUCTOR DEVICE WITH REFLECTOR

BACKGROUND OF THE INVENTION

1. Field of the Invention

This invention relates to a semiconductor device capable of emitting light and provided with a reflector for the light. More particularly, it relates to a semiconductor device, such as a light-emitting diode, used for backlighting a push button in a small electric device such as a portable telephone.

2. Description of the Related Art

Small electronic devices such as portable telephones have been widely used lately because of their handiness. Needless to say, portable telephones are provided with a number of push buttons operated for making a call or performing other functions. The push buttons of a recent portable telephone may be backlit by small light sources, so that the user can operate the device even in the dark. For the light source, use may be made of an LED (light-emitting diode).

FIGS. 12 and 13 show a conventional light-emitting diode provided with a reflector. As illustrated, the conventional diode Y is constituted by a rectangular base unit 1', an LED chip 3' mounted on the unit 1' and a casing 5' enclosing the LED chip 3'.

The base unit 1' is composed of an insulating substrate 1A', a first electrode 2A' and a second electrode 2B'. The electrodes 2A' and 2B', which are electrically insulated from each other, extend from the upper surface 10' of the substrate 1A' onto the lower surface 12' through a side surface 11'. The electrodes 2A' and 2B' have upper portions 2a' and 2b', respectively, which extend on the upper surface 10' of the substrate 1A'. These electrodes 2A', 2B' may be made by etching a conductive metal layer formed on the substrate 1A'.

The LED chip 3' is arranged on the upper portion 2a' of the first electrode 2A' and is electrically connected thereto. The top surface 30' of the LED chip 3' is electrically connected to the upper portion 2b' of the second electrode 2B' via a wire 4' made of gold for example.

The casing 5' is formed with a cavity 50a', defined by an inner wall surface 5a' of the casing 5'. As shown in FIGS. 12 and 13, the cavity 50a' is made in the form of a reversed, truncated cone extending through the thickness of the casing 5'. Thus, when the casing 5' is mounted on the substrate 1A', the LED chip 3A' and the wire 4' are disposed in the cavity 50a'.

As shown in FIG. 13, the inner wall surface 5a' is covered with a metal film 5b' formed by sputtering or vacuum evaporation. The metal film 5b' is rendered reflective so as to work as a light-reflecting member or reflector. As illustrated, the cavity 50a' is filled up with transparent resin 50' (such as epoxy resin) which is highly permeable to light. The resin 50' will be referred to as the "light-permeable portion" below.

With the above arrangement, part of the light emitted from the LED chip 3A' is reflected by the metal layer 5b' before getting out of the light-permeable member 50', while the other part of the emitted light passes through the light-permeable member 50' without being reflected by the metal layer 5b'. As a result, a light beam having a generally cylindrical form is emitted from the light-permeable member 50'.

As stated above, the light-emitting diode Y, which is usable as a backlight for a push button of a portable telephone, is arranged to emit a generally cylindrical light beam. On the other hand, the push buttons of a portable telephone are often made in a non-circular form (e.g. elliptical or rectangular). Under these circumstances, the light-emitting diode Y fails to properly brighten the entirety of a push button. This shortcoming may be overcome by using more than one light-emitting diode Y for illuminating a single push button. However, it is clear that such a solution will disadvantageously lead to a cost increase.

SUMMARY OF THE INVENTION

It is, therefore, an object of the present invention to provide a semiconductor device which is capable of properly backlighting a non-circular push button of an electronic device.

According to the present invention, there is provided a semiconductor device comprising:

a substrate provided with a first electrode and a second electrode formed thereon;

a semiconductor chip mounted on the substrate for emitting light, the semiconductor chip being electrically connected to the first electrode and the second electrode; and a reflector enclosing the semiconductor chip for reflecting the light emitted from the semiconductor chip;

wherein the reflector has an elongated transverse section.

The elongated transverse section may be oblong, elliptical, rhombic, or rectangular.

According to a preferred embodiment of the present invention, the reflector may have a first vertical section defining a quadric curve.

Further, the reflector may have a second vertical section intersecting the first vertical section at right angles. The second vertical section may define a quadric curve.

The reflector may define a quadric surface tapering toward the semiconductor chip.

According to a preferred embodiment of the present invention, the semiconductor chip may be a light-emitting diode chip.

According to another preferred embodiment, the semiconductor chip may be a laser diode chip.

The semiconductor device of the present invention may further comprise a casing supported by the substrate. The casing may be provided with an inner surface defining a cavity, wherein the inner surface serves as the reflector.

Preferably, the casing may be made of a reflective material.

Preferably, the casing may be white.

Preferably, the casing may be made of a polycarbonate resin containing titanium oxide.

According to another preferred embodiment of the present invention, the semiconductor device may further comprise a casing supported by the substrate and a light reflecting film as the reflector. In this case, the casing may be provided with an inner surface defining a cavity, and the light reflecting film is formed on the inner surface.

Preferably, the light reflecting film may be made of metal.

Further, the light reflecting film may be white.

Preferably, the light reflecting film may be made of a polycarbonate resin containing titanium oxide.

The semiconductor device of the present invention may further comprise a light-permeable member, wherein the reflector defines a space accommodating the light-permeable member.

Preferably, the light-permeable member may be made of an epoxy resin.

Other features and advantages of the present invention will become apparent from the detailed description given below with reference to the accompanying drawings.

DETAILED DESCRIPTION OF THE PREFERRED EMBODIMENTS

Preferred embodiments of the present invention will be described below with reference to the accompanying drawings.

FIGS. 1–4 show a light-emitting diode X1 according to a first embodiment of the present invention. The illustrated diode X1 may be used as a backlight for a push button of a small electric device such as a portable telephone.

The light-emitting diode X1 has a rectangular base unit 1, an LED chip 3A arranged thereon, and a casing 5 enclosing the LED chip 3A. The base unit 1 includes a rectangular insulating substrate 1A, a first electrode 2A and a second electrode 2B. Since the substrate 1A is required to have excellent insulating and heat-resistant properties, it may be made of a polyimide resin such as BT resin (trade name, manufactured by MITSUBISHI GAS CHEMICAL CO., INC.), or a ceramic material.

Figure 3:
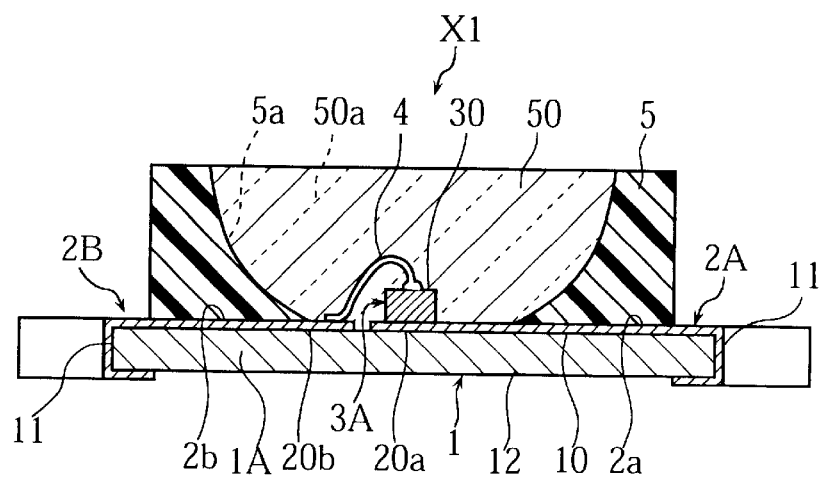
FIG. 3 is a sectional view taken along the lines III—III in FIG. 2.
Figure 4:
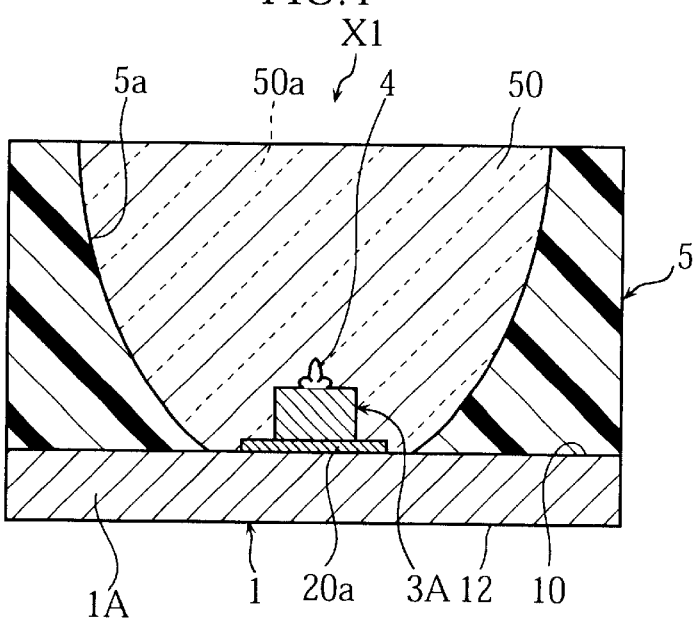
FIG. 4 is a sectional view taken along the lines IV—IV in FIG. 2.

As shown in FIG. 3, each of the electrodes 2A, 2B is formed on the substrate 1A, extending from the upper surface 10 through a side surface 11 to the lower surface 12 of the substrate 1A. The electrodes 2A, 2B are spaced from each other to be electrically insulated.

The electrodes 2A, 2B may be formed in the following manner. First, a conductive metal layer made of e.g. copper or nickel is formed on the substrate 1A, and then etched to remove unnecessary portions. At this stage, two separate conductive elements (one for the first electrode 2A and the other for the second electrode 2B) are formed. Finally, the conductive elements are gold-plated by e.g. electroplating to provide the first and the second electrodes 2A, 2B. As a result of such gold-plating, the electrodes 2A, 2B become highly resistant to oxidation, and a wire will be firmly bonded to these electrodes.

Figure 1:
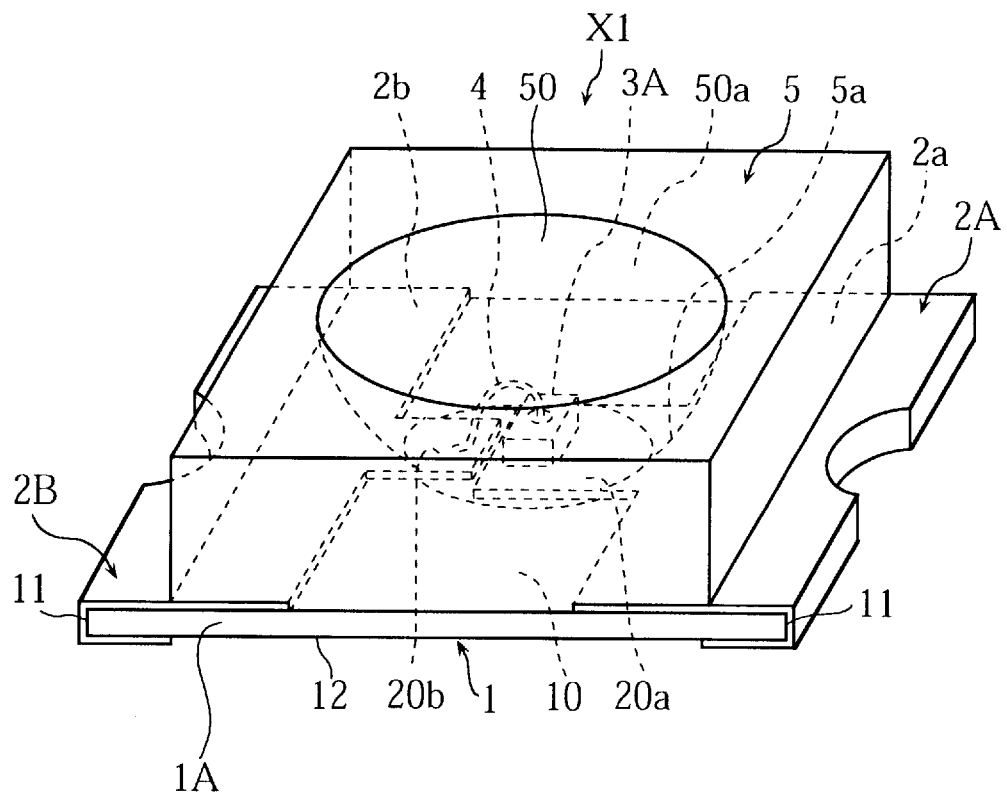
FIG. 1 is a perspective view showing a light-emitting diode according to a first embodiment of the present invention.

As shown in FIGS. 1 and 3, the first electrode 2A has an upper portion 2a formed on the upper surface 10 of the substrate 1A. The upper portion 2a includes a die-bonding region 20a (protruding toward the second electrode 2B) onto which the LED chip 3A is mounted. Though not shown, silver paste is applied between the LED chip 3A and the die-bonding region 20a, so that the chip 3A and the region 20a are electrically and fixedly connected to each other.

Similarly, the second electrode 2B has an upper portion 2b formed on the upper surface 10 of the insulating substrate 1A. The upper portion 2b includes a wire-bonding region 20b protruding the first electrode 2A. The wire-bonding region 20b and the top surface 30 of the LED chip 3A are electrically connected to each other by a wire 4 made of gold for example.

The casing 5 placed on the base unit 1 is formed with a cavity 50a for housing the LED chip 3A and the wire 4. As shown in FIG. 3 for example, the cavity 50a is defined by an inner wall surface 5a of the casing 5. The cavity 50a extends through the thickness of the casing 5 to be open upward and downward.

As shown in FIG. 3, the cavity 50a is filled up with a transparent resin material which is highly permeable to light. The resin material may be an epoxy resin containing no filler. After being hardened, the transparent resin material serves as a light-permeable member 50.

The casing 5 is made of a highly reflective white material such as a polycarbonate resin containing a titanium oxide as filler. Accordingly, the inner wall surface 5a of the casing 5 is rendered highly reflective. Thus, the inner wall surface 5a serves as an excellent reflector for light emitted from the LED chip 3A.

As viewed in horizontal (or transverse) section (see FIG. 2), the inner wall surface 5a gives an elliptical appearance, while as viewed in two vertical sections intersecting at right angles (see FIGS. 3 and 4), it gives an appearance of a quadric curve (curve of second order). Clearly, the light-permeable member 50, fitted in the cavity 50a, has the same curved surface as the inner wall surface 5a.

The casing 5 and the light-permeable member 50 are formed as follows. The casing 5, which is made of the abovementioned resin material by e.g. transfer molding, is prepared separately from the light-permeable member 50. The casing 5 is then attached to the base unit 1 (onto which the LED chip 3A with the wire 4 has already been mounted). Then, a transparent resin is filled into the cavity 50a of the casing 5 by potting, thereby forming the light-permeable member 50. Alternatively, the light-permeable member 50 may be formed by transfer molding.

The light-emitting diode X1 described above has the following advantages.

When voltage is applied to the light-emitting diode X1 in the forward direction, the LED chip 3A emits light. Part of the light emitted from the LED chip 3A passes through the light-permeable member 50 without reflection. On the other hand, the remaining part of the emitted light is reflected (once or more) by the inner wall surface 5a (which is highly reflective) while traveling through the light-permeable member 50. The thus reflected light and non-reflected light are eventually emitted from the light-permeable member 50 to form a light beam together.

Figure 2:
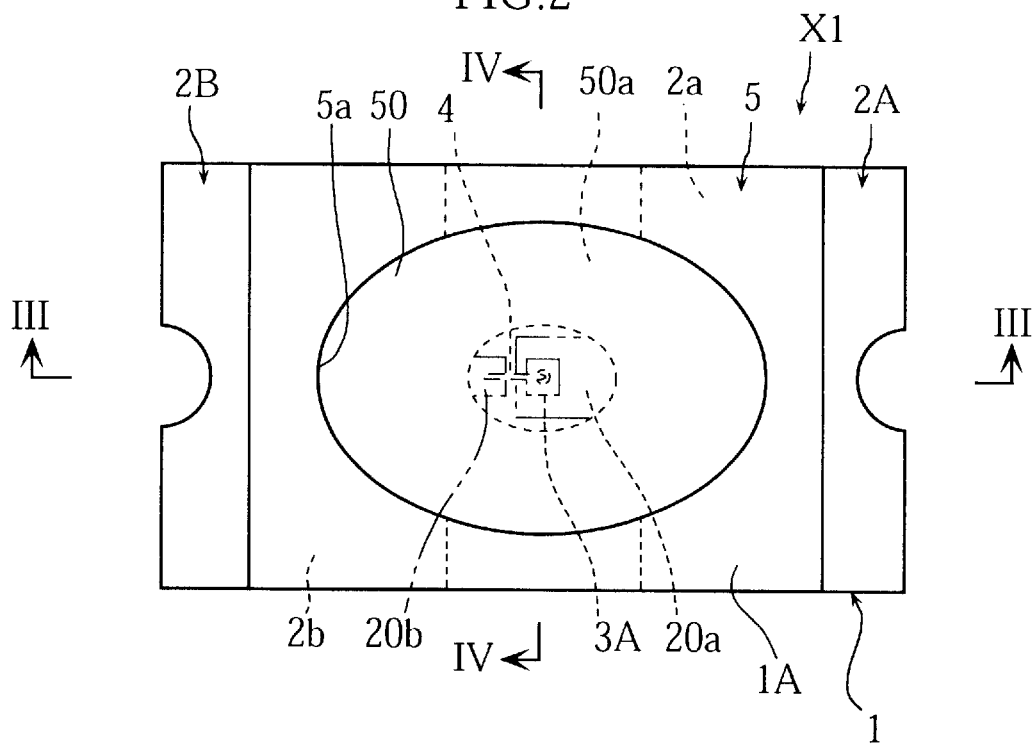
FIG. 2 is a plan view of the light-emitting diode of FIG. 1.

Since the inner wall surface 5a defines an elliptical figure in the top surface of the casing 5 as shown in FIG. 2, the light beam from the light-emitting diode X1 is also elliptical in horizontal cross-section. Therefore, even if a portable telephone has an elongated push button, a single light-emitting diode X1 suffices for lighting up the entirety of the push button. Thus, there is no need to use a plurality of light-emitting diodes for a single push button. In addition, since the inner wall surface 5a forms a quadric surface (part of a generally elliptic paraboloid), light beams emitted from the diode X1 are advantageously directed toward substitutionally the same direction.

Figure 5:
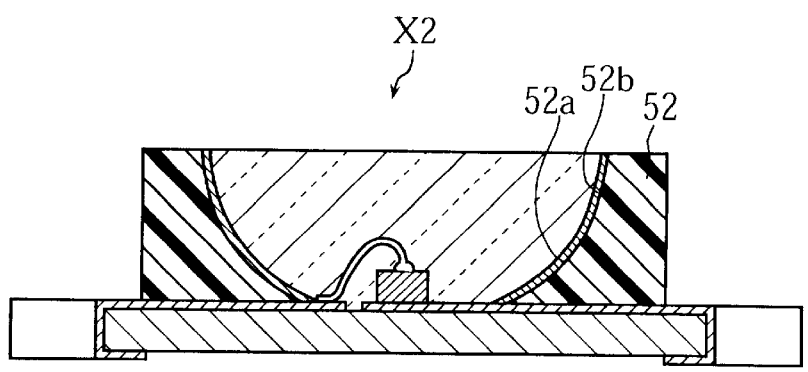
FIG. 5 is a sectional view illustrating a light-emitting diode according to a second embodiment of the present invention.

In the above embodiment, the inner wall 5a of the casing 5 works as the reflector. However, the present invention is not limited to this arrangement. In this connection, reference is now made to FIG. 5 showing a light-emitting diode X2 according to a second embodiment of the present invention. The illustrated diode X2 is basically similar to the diode X1 of the first embodiment, except that use is made of a light-reflecting film 52b as a reflector formed on the inner wall surface 52a of a casing 52. The light-reflecting film 52b may be prepared by sputtering or vacuum evaporation of high light-reflective metal. Alternatively, the film 52b may be made of a reflective resin material such as polycarbonate resin containing titanium oxide.

In the above two embodiments, the reflective inner wall surface 5a (the first embodiment) and the additional reflecting film 52b (the second embodiment) both taper toward the LED chip.

Figure 6:
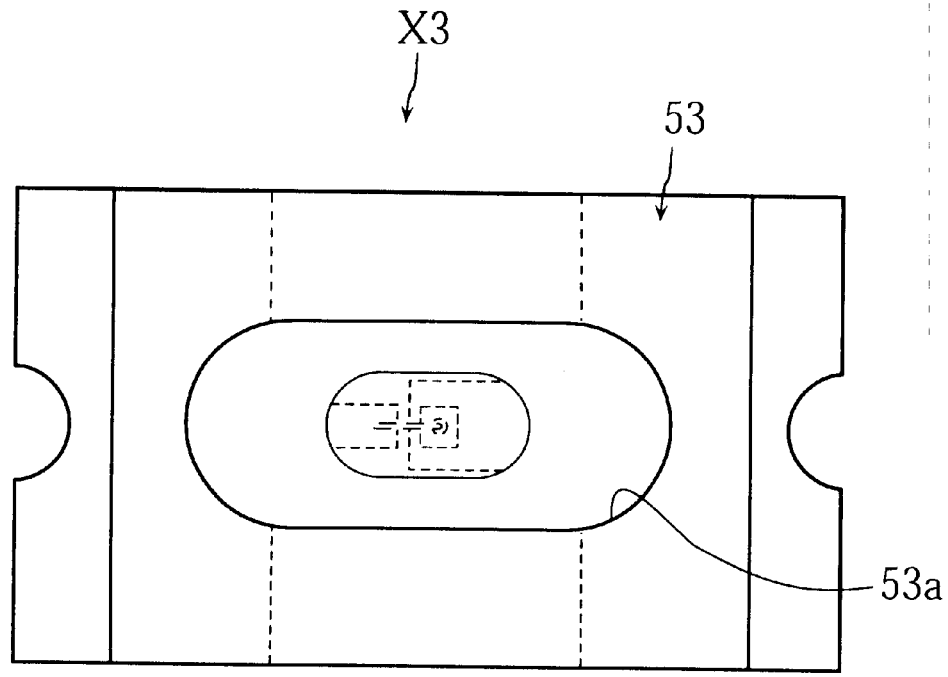
FIG. 6 is a plan view illustrating a light-emitting diode according to a third embodiment of the present invention.

FIG. 6 shows a light-emitting diode X3 according to a third embodiment of the present invention. The illustrated diode X3 is basically similar to the diode X1 of the first embodiment, except that the inner wall surface 53a of a casing 53 appears, in horizontal section, to be oblong but not elliptic. In this embodiment, differing from the second embodiment X2 (FIG. 5), no separate reflective film is formed on the inner wall surface 53a of the casing 53. Thus, the casing 53 needs to be made of a reflective resin material.

Figure 7:
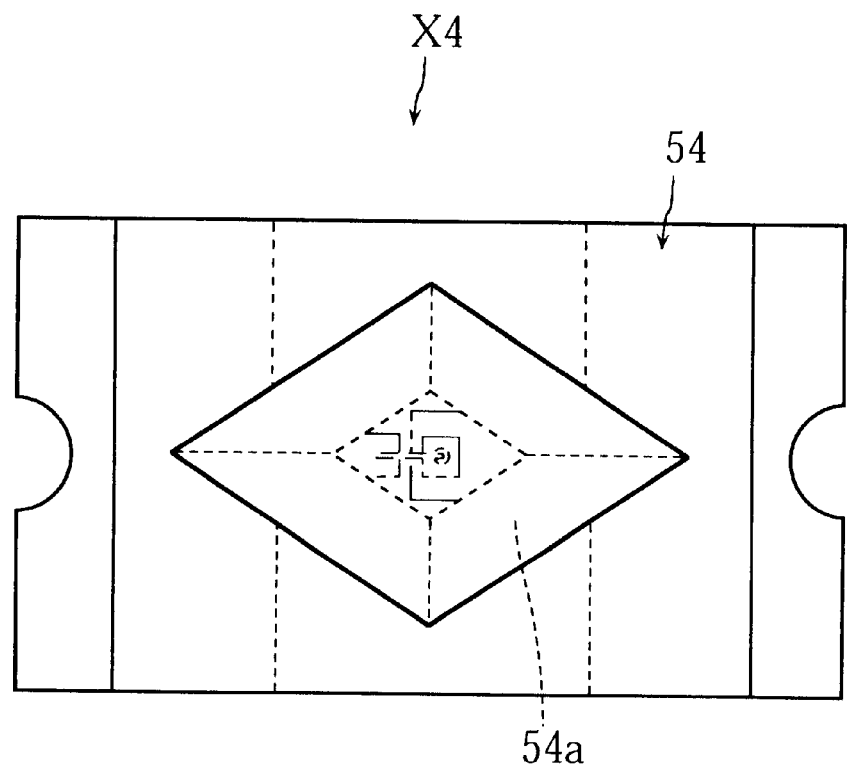
FIG. 7 is a plan view illustrating a light-emitting diode according to a fourth embodiment of the present invention.

FIG. 7 shows a light-emitting diode X4 according to a fourth embodiment of the present invention. The illustrated diode X4 is basically similar to the diode X1 of the first embodiment, except that the inner wall surface 54a of a casing 54 appears, in horizontal section, to be rhombic.

Figure 8:
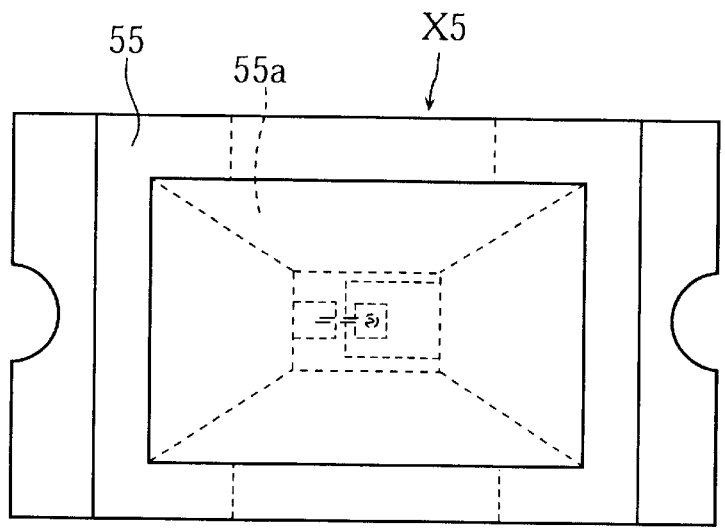
FIG. 8 is plan view illustrating a light-emitting diode according to a fifth embodiment of the present invention.

FIG. 8 shows a light-emitting diode X5 according to a fifth embodiment of the present invention. The illustrated diode X5 is basically similar to the diode X1 of the first embodiment, except that the inner wall surface 55a of a casing 55 appears, in horizontal section, to be rectangular.

Figure 9:
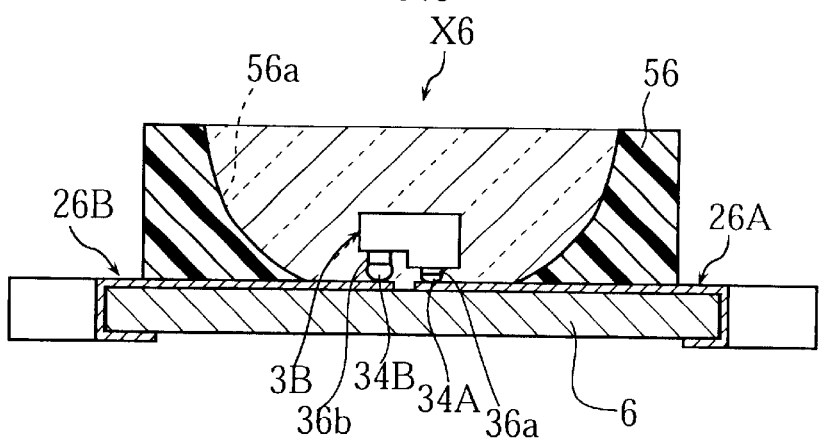
FIG. 9 is a sectional view illustrating a laser diode according to a sixth embodiment of the the present invention.

FIG. 9 shows a semiconductor device X6 according to a sixth embodiment of the present invention. The illustrated device X6 includes an LD (laser diode) chip 3B instead of an LED chip. The LD chip 3B are provided with two terminals 36a and 36b facing in the same direction (downward). One terminal 36a is connected, via a conductor 34A, to a first electrode 26A formed on an insulating substrate 16, while the other terminal 36b is connected, via another conductor 34B, to a second electrode 26B. A casing 56 may be similar in configuration to the casing 5 of the first embodiment, so that the inner wall surface 56a of this embodiment and the counterpart of the first embodiment may also be similar.

Figure 10:
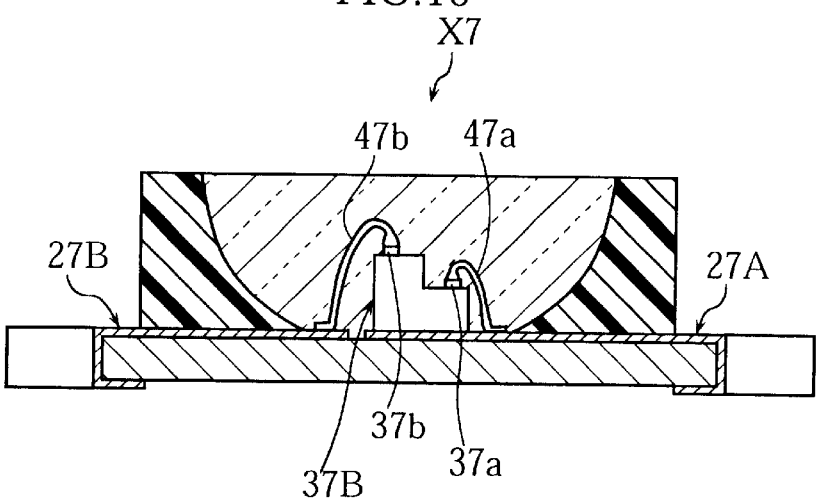
FIG. 10 is a sectional view illustrating a laser diode according to a seventh embodiment of the present invention.

FIG. 10 shows a laser diode X7 according to a seventh embodiment of the present invention. The illustrated diode X7 is basically similar to the diode X6 of the sixth embodiment (FIG. 9) except for the following points. First, an LD chip 37B is mounted onto a first electrode 27A only so as not to be in direct contact with a second electrode 27B. Second, two terminals 37a and 37b of the LD chip 37B are directed upward. Thus, use is made of a wire 47a for connecting one terminal 37a to the first electrode 27A, while another wire 47b is used for connecting the other terminal 37b to the second electrode 27B.

Figure 11:
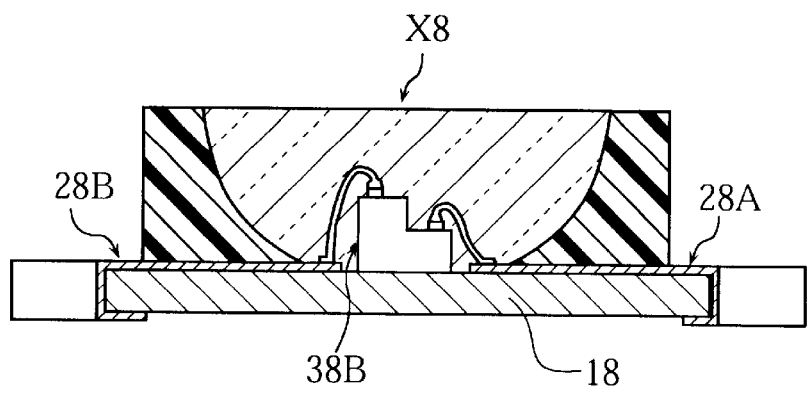
FIG. 11 is a sectional view illustrating a laser diode according to an eighth embodiment of the present invention.
Figure 12:
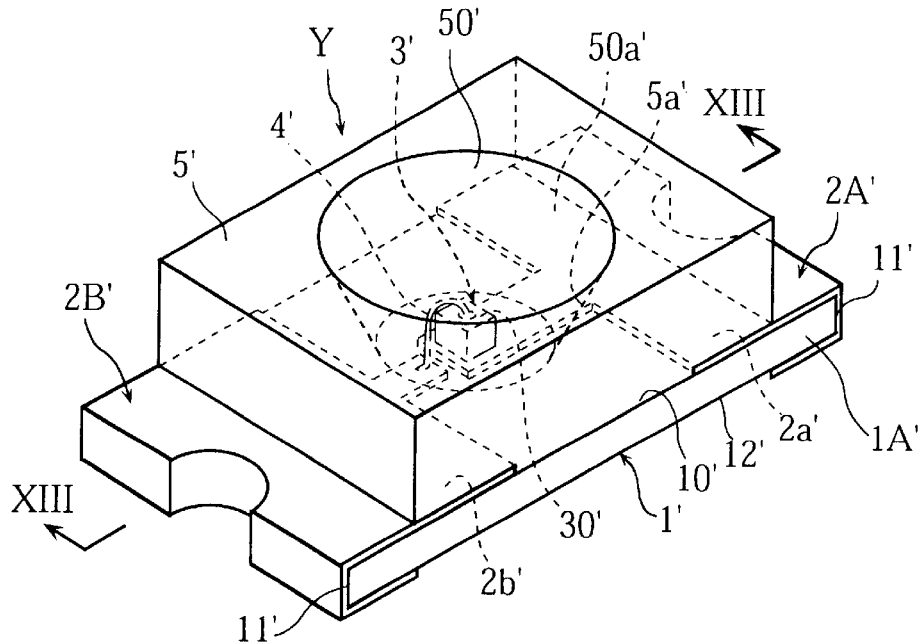
FIG. 12 is a perspective view of a conventional light-emitting diode.
Figure 13:
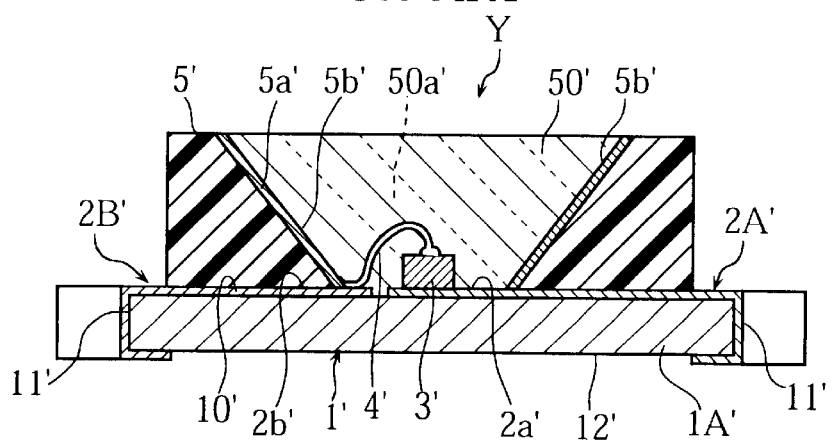
FIG. 13 is a sectional view taken along the lines XIII—XIII in FIG. 12.

FIG. 11 shows a laser diode X8 according to an eighth embodiment of the present invention. The illustrated diode X8 is basically similar to the diode X7 of the seventh embodiment (FIG. 10), except that an LD chip 38B is arranged between first and second electrodes 28A, 28B, so that the chip 38B is mounted directly on an insulating substrate 18.

The present invention being thus described, it is apparent that the same may be varied in many ways. Such variations are not to be regarded as a departure from the spirit and scope of the present invention, and all such modifications as would be obvious to those skilled in the art are intended to be included in the scope of the appended claims.

What is claimed is:

1. A semiconductor device comprising:

a substrate provided with a first electrode and a second electrode formed thereon;

a semiconductor chip mounted on the substrate for emitting light, the semiconductor chip being electrically connected to the first electrode and the second electrode; and a casing for enclosing the semiconductor chip, the casing including a reflecting cavity tapering toward the semiconductor chip for reflecting the light emitted from the semiconductor chip;

wherein the reflecting cavity is longer in a first direction than in a second direction perpendicular to the first direction;

wherein the reflecting cavity defines a first parabolic curve in a first vertical section extending in the first direction; and wherein the reflecting cavity defines a second parabolic curve in a second vertical section extending in the second direction, the second parabolic curve being different from the first parabolic curve.

2. The semiconductor device according to claim 1, wherein the semiconductor chip is a light-emitting diode chip.

3. The semiconductor device according to claim 1, wherein the semiconductor chip is a laser diode chip.

4. The semiconductor device according to claim 1, wherein the casing is made of a reflective material.

5. The semiconductor device according to claim 1, wherein the casing is white.

6. The semiconductor device according to claim 1, wherein the casing is made of a polycarbonate resin containing titanium oxide.

7. The semiconductor device according to claim 1, wherein the reflecting cavity is formed with a light reflecting film.

8. The semiconductor device according to claim 7, wherein the light reflecting film is made of metal.

9. The semiconductor device according to claim 7, wherein the light reflecting film is white.

10. The semiconductor device according to claim 7, wherein the light reflecting film is made of a polycarbonate resin containing titanium oxide.

11. The semiconductor device according to claim 1, further comprising a light-permeable member accommodated in the reflecting cavity of the casing.

12. The semiconductor device according to claim 11, wherein the light-permeable member is made of an epoxy resin.

* * * * *